(12) United States Patent
Lee et al.

(10) Patent No.: US 12,740,049 B2
(45) Date of Patent: Sep. 15, 2026

(54) SEMICONDUCTOR MEMORY DEVICE

(71) Applicant: Samsung Electronics Co., Ltd., Suwon-si (KR)

(72) Inventors: Jun-Bum Lee, Suwon-si (KR); Junsoo Kim, Suwon-si (KR); Jae Hyun Choi, Suwon-si (KR); Dongsik Kong, Suwon-si (KR); Jihye Kwon, Suwon-si (KR); Taeyoon An, Suwon-si (KR); Hyun Seung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 310 days.

(21) Appl. No.: 18/383,201

(22) Filed: Oct. 24, 2023

(65) Prior Publication Data

US 2024/0315008 A1 Sep. 19, 2024

(30) Foreign Application Priority Data

Mar. 16, 2023 (KR) ........................ 10-2023-0034665

(51) Int. Cl.
*H10B 12/00* (2023.01)

(52) U.S. Cl.
CPC ........... *H10B 12/34* (2023.02); *H10B 12/053* (2023.02); *H10B 12/315* (2023.02)

(58) Field of Classification Search
CPC .... H10B 12/34; H10B 12/053; H10B 12/315; H10B 12/488; H10B 12/30; H10B 63/30; H10B 12/482; H01L 21/76224
See application file for complete search history.

(56) References Cited

U.S. PATENT DOCUMENTS

| | | | | |
|---|---|---|---|---|
| 9,287,374 | B2 * | 3/2016 | Lee | H10D 64/513 |
| 9,853,031 | B1 * | 12/2017 | Cho | H10B 12/34 |
| 9,881,924 | B2 * | 1/2018 | Wang | H10B 12/312 |
| 10,062,613 | B1 * | 8/2018 | Chang | H10D 84/0142 |
| 10,211,086 | B2 * | 2/2019 | Nagai | H10W 10/031 |
| 10,615,164 | B2 * | 4/2020 | Kim | H10B 12/34 |
| 11,056,175 | B1 * | 7/2021 | Ikeda | G11C 11/4085 |

(Continued)

FOREIGN PATENT DOCUMENTS

| | | | |
|---|---|---|---|
| KR | 101159692 | B1 | 6/2012 |
| KR | 20200131191 | A | 11/2020 |
| KR | 20210048700 | A | 5/2021 |

*Primary Examiner* — Victor A Mandala
(74) *Attorney, Agent, or Firm* — Muir Patent Law, PLLC

(57) ABSTRACT

A semiconductor memory device is provided. The semiconductor device may include a semiconductor substrate having a device isolation trench defining active regions, a device isolation layer disposed in the device isolation trench, gate trenches extending in a first direction and crossing the active regions of the semiconductor substrate and the device isolation layer, word lines disposed in the gate trenches, respectively, each of the gate trenches may include first trench sections in the active regions and second trench sections in the device isolation layer, the first trench sections may have a first depth, and the second trench section may have a second depth greater than the first depth, the device isolation layer may include a lower portion positioned at a level lower than bottom surfaces of the first trench sections and an upper portion on the lower portion, and the lower portion may be formed of a dielectric material having a lower dielectric constant than that of the upper portion.

18 Claims, 19 Drawing Sheets

(56) References Cited

U.S. PATENT DOCUMENTS

| | | | | |
|---|---|---|---|---|
| 11,239,311 | B2 * | 2/2022 | Kim | H10D 62/115 |
| 2007/0190742 | A1 | 8/2007 | Chou et al. | |
| 2016/0133742 | A1 * | 5/2016 | Okuda | H10D 30/668<br>438/270 |
| 2017/0084615 | A1 * | 3/2017 | Lee | H10B 12/053 |
| 2019/0221569 | A1 * | 7/2019 | Nagai | H10B 12/0335 |
| 2020/0161305 | A1 * | 5/2020 | Nam | H10B 12/34 |
| 2020/0161306 | A1 * | 5/2020 | Seo | H10B 12/34 |
| 2020/0219885 | A1 * | 7/2020 | Kim | H10B 12/34 |
| 2021/0126090 | A1 * | 4/2021 | Kim | H10D 62/115 |
| 2021/0249417 | A1 * | 8/2021 | Kim | H10B 12/34 |
| 2021/0351186 | A1 * | 11/2021 | Seo | H10B 12/34 |
| 2022/0077154 | A1 * | 3/2022 | Kim | H10B 12/34 |
| 2022/0262803 | A1 * | 8/2022 | Jang | H10B 12/34 |
| 2023/0180466 | A1 * | 6/2023 | Hsiao | H10B 12/488<br>438/430 |
| 2024/0332059 | A1 * | 10/2024 | Kim | H10P 52/402 |

* cited by examiner

BLS
150
147
145
143
141
DC
112
114
116
STI
100
C'
1a
ACT
B'C
1b
DS
150
LP
FP
BC
130
127
125
123
121
WLS
ST
100
B
D2
D4

DS
150
LP
147
145
143
141
BLS
BC
114
112
STI
100
1a
1b
E'
E
D'
D
ACT
112 114
150
SS
147
145
143
141
130
127
125
123
121
116
114
112
100
BLS
WLS
STI
D1
D4

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2023-0034665, filed on Mar. 16, 2023, in the Korean Intellectual Property Office, the entire contents of which are hereby incorporated by reference.

BACKGROUND

The present disclosure relates to a semiconductor memory device, and more particularly, relates to a semiconductor memory device with improved reliability.

Semiconductor devices have been widely used in electronic industry because of their small size, multi-functionality, and/or low fabrication cost. As the semiconductor devices become increasingly integrated with the advancement of the electronic industry, line widths of patterns of the semiconductor devices are being reduced for high integration thereof. However, since new exposure techniques and/or expensive exposure systems may be required for printing these fine patterns, to highly integrate the semiconductor devices may not be easy. Thus, various research has recently been conducted for new integration techniques.

SUMMARY

Some example embodiments provide a semiconductor memory device with improved reliability.

The present disclosure is not limited to addressing the problems mentioned above, and other objects not mentioned will be clearly understood by those skilled in the art from the description below.

According to example embodiments, a semiconductor memory device may include a semiconductor substrate having a device isolation trench defining active regions, a device isolation layer disposed in the device isolation trench, gate trenches extending in a first direction with each gate trench crossing a respective plurality of the active regions of the semiconductor substrate and the device isolation layer, and word lines disposed in the gate trenches, respectively, each of the gate trenches may include first trench sections in the active regions and a second trench section in the device isolation layer, the first trench sections may have a first depth, and the second trench section may have a second depth greater than the first depth, the device isolation layer may include a lower portion positioned at a level lower than bottom surfaces of the first trench sections and an upper portion on the lower portion, and the lower portion may be formed of a dielectric material having a lower dielectric constant than that of the upper portion.

According to example embodiments, a semiconductor memory device may include a semiconductor substrate, a device isolation layer disposed in the semiconductor substrate and defining active regions, a first gate trench having a first trench section in the active regions and having a first depth, a second gate trench having a second trench section in the device isolation layer and having a second depth greater than the first depth, a first gate structure in the first trench section, and a second gate structure in the second trench section, the second gate structure may include a lower portion positioned at a level lower than a bottom surface of the first trench section and an upper portion on the lower portion, and the device isolation layer may include a low-k dielectric pattern between the active regions and the lower portion of the second gate structure, and a liner insulating pattern between the active regions and the upper portion of the second gate structure.

According to example embodiments, a semiconductor memory device may include a semiconductor substrate, a device isolation layer disposed in the semiconductor substrate and defining active regions, gate trenches extending in a first direction crossing the active regions and the device isolation layer, word lines with each word line disposed in a respective gate trench, each of the word lines including a gate conductive pattern, a gate capping pattern on the gate conductive pattern, and a gate insulating pattern between the semiconductor substrate and the gate conductive pattern, a bit line structure extending in a second direction intersecting with the first direction across the word lines, a bit line contact pattern between the bit line structure and the active regions, bit line spacers disposed on sidewalls of the bit line structure, contact patterns disposed on the semiconductor substrate and connected to end portions of the active regions, and data storage patterns connected to the contact patterns, each of the gate trenches may include first trench sections in the active regions and a second trench sections in the device isolation layer, and a recess depth of the second trench sections may be greater than a recess depth of the first trench sections, the device isolation layer may include a lower portion positioned at a level lower than bottom surfaces of the first trench sections and an upper portion on the lower portion, and the lower portion may be formed of a dielectric material having a lower dielectric constant than that of a material forming the upper portion.

Details of other embodiments are included in the detailed description and drawings.

BRIEF DESCRIPTION OF DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
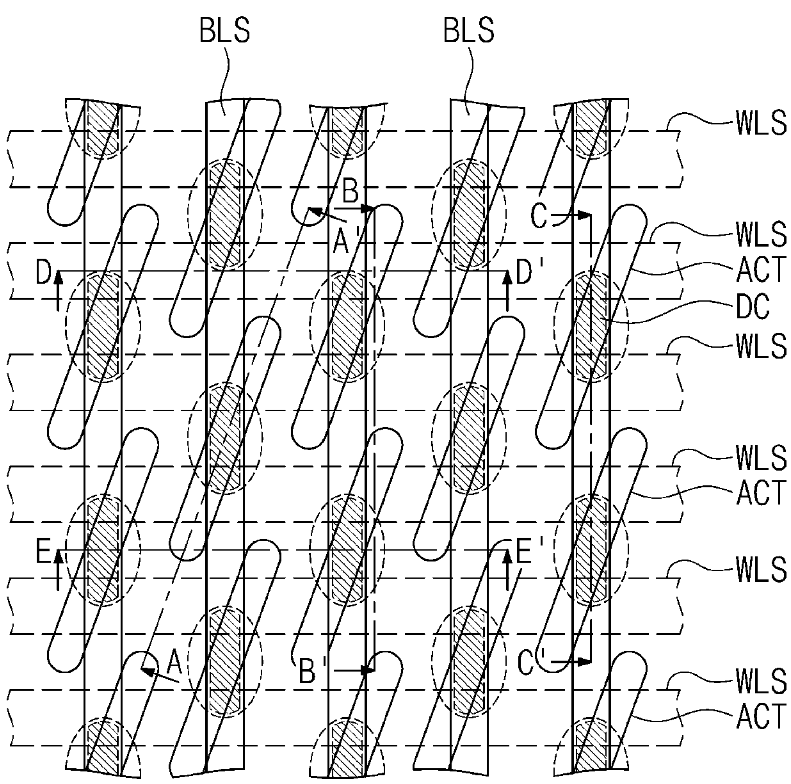
FIG. 1 illustrates a plan view showing a semiconductor memory device according to some example embodiments of the present disclosure.
Figure 1:
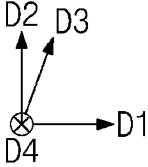

Hereinafter, a semiconductor memory device and a method of manufacturing the same according to some example embodiments of the present disclosure will be described in detail with reference to the accompanying drawings. It will be understood that in the following description, unless otherwise indicated, that ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. A term that is referenced with a particular ordinal number (e.g., "first" in a particular claim) may be described elsewhere with a different ordinal number (e.g., "second" in the specification or another claim). Additionally, the use of the ordinal number does not indicate any particular order for arranging the elements unless otherwise indicated.

Items described in the singular herein may be provided in plural, as can be seen, for example, in the drawings. Thus, the description of a single item that is provided in plural should be understood to be applicable to the remaining plurality of items unless context indicates otherwise.

Figure 2A:
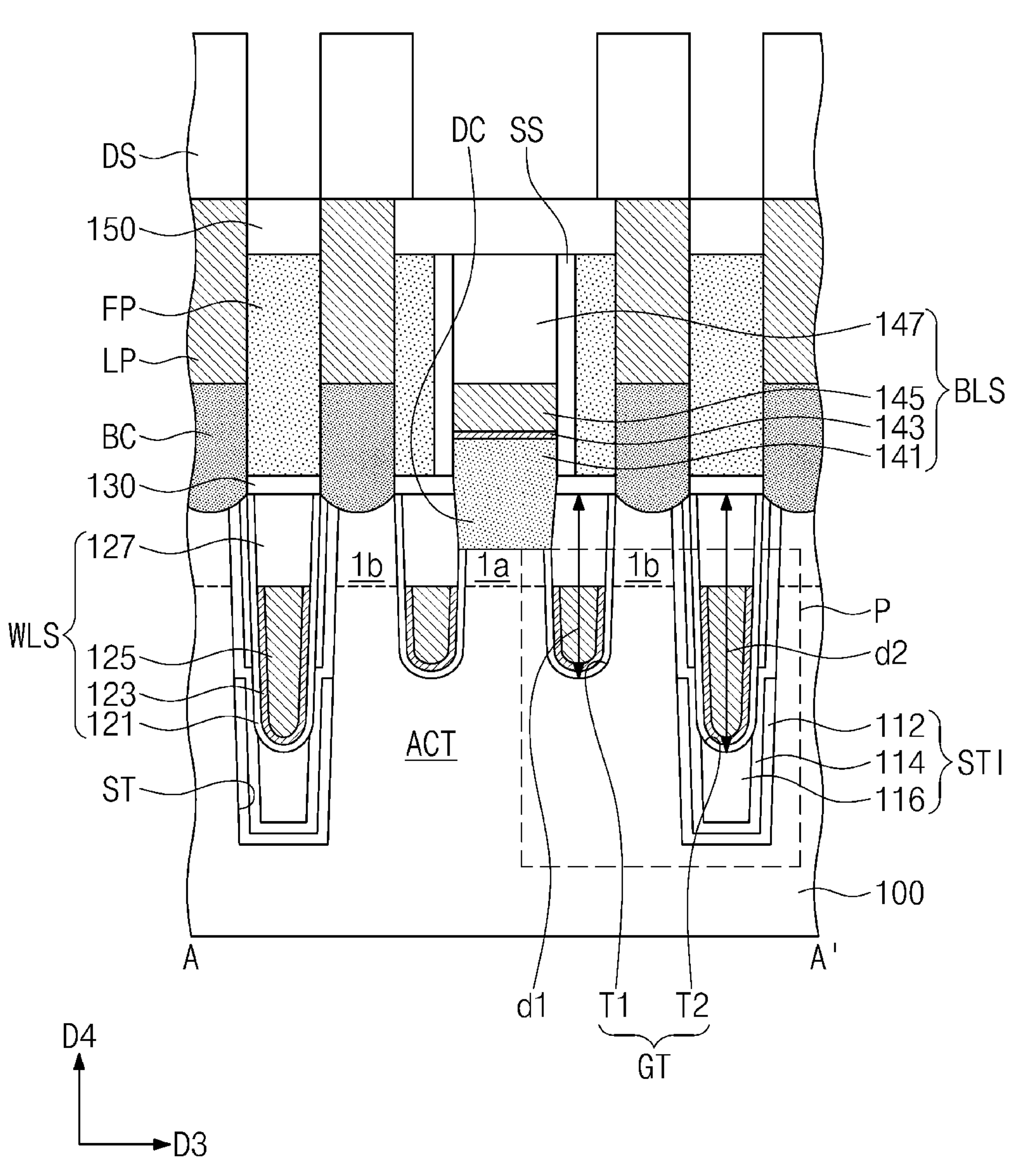
FIG. 2A illustrates a cross-sectional view taken along line A-A' of FIG. 1.
Figure 2B:
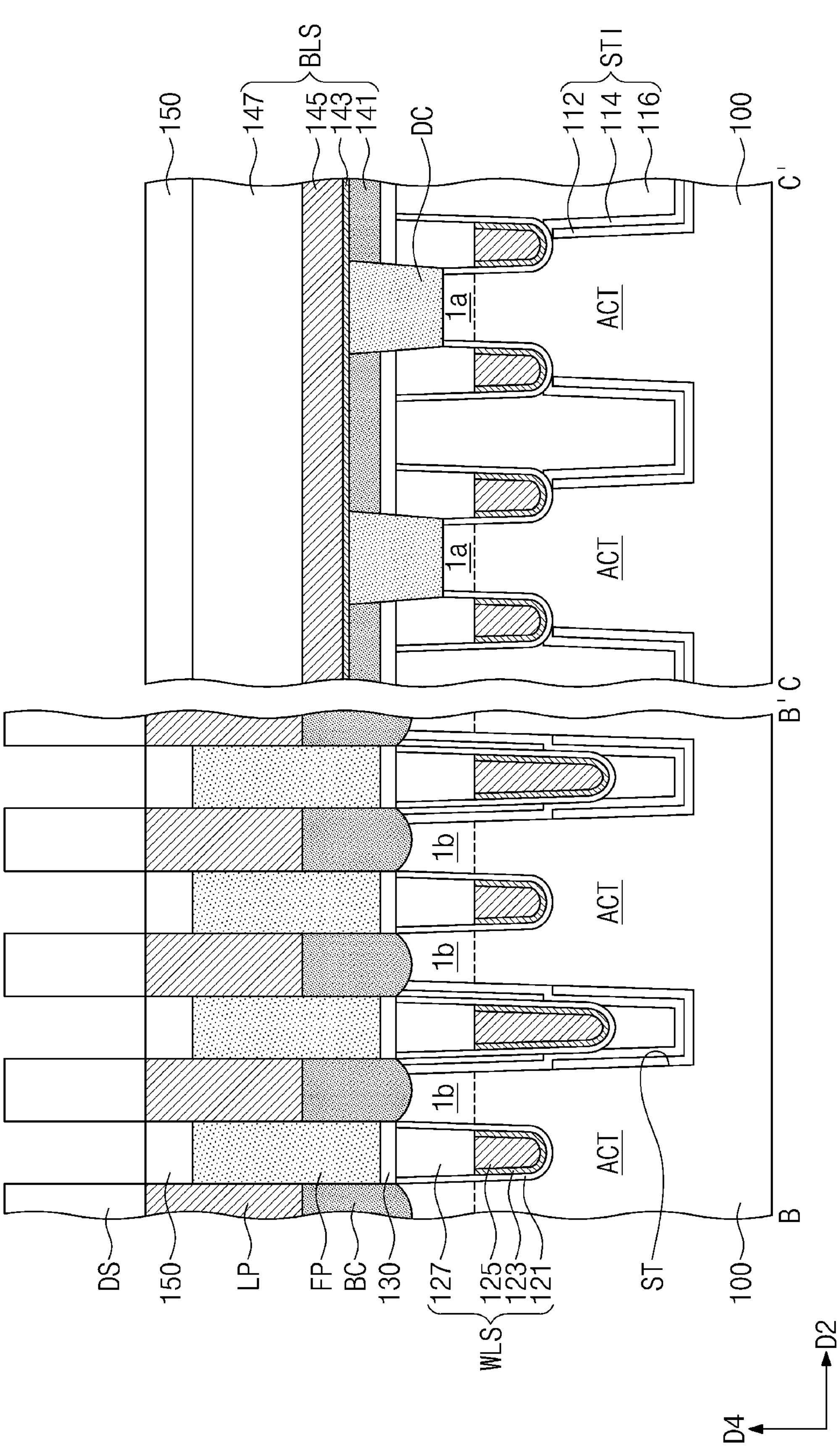
FIG. 2B illustrates a cross-sectional view taken along lines B-B' and C-C' of FIG. 1.
Figure 2C:
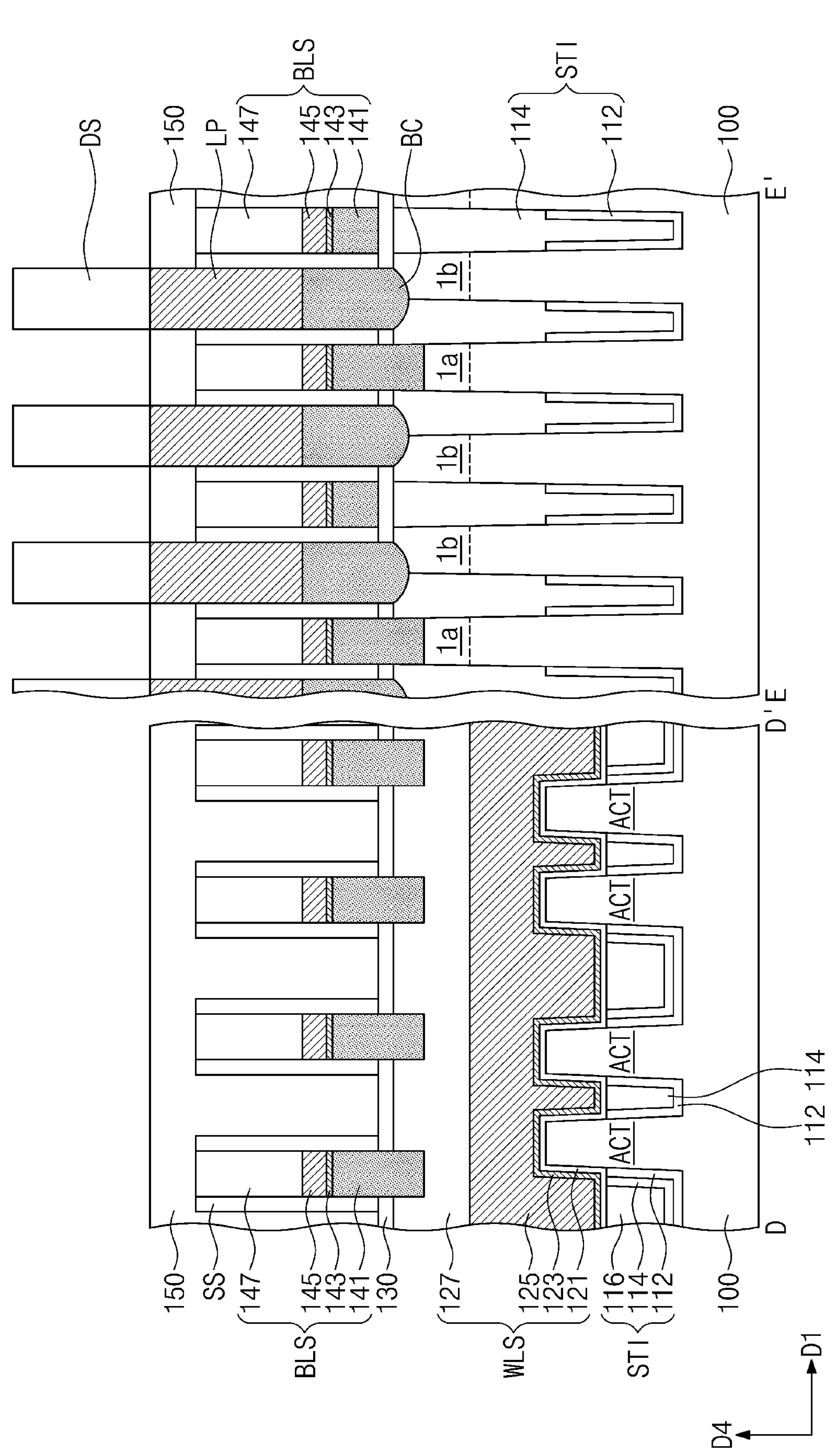
FIG. 2C illustrates a cross-sectional view taken along lines D-D' and E-E' of FIG. 1.
Figure 3A:
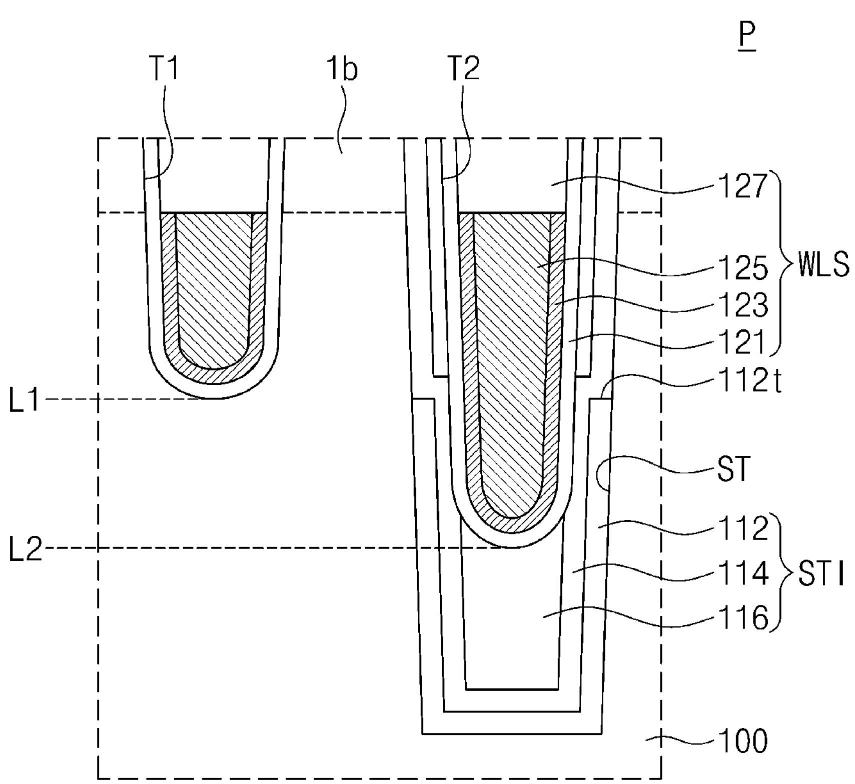
FIGS. 3A and 3B are enlarged views of part 'P' of FIG. 2A.
Figure 3B:
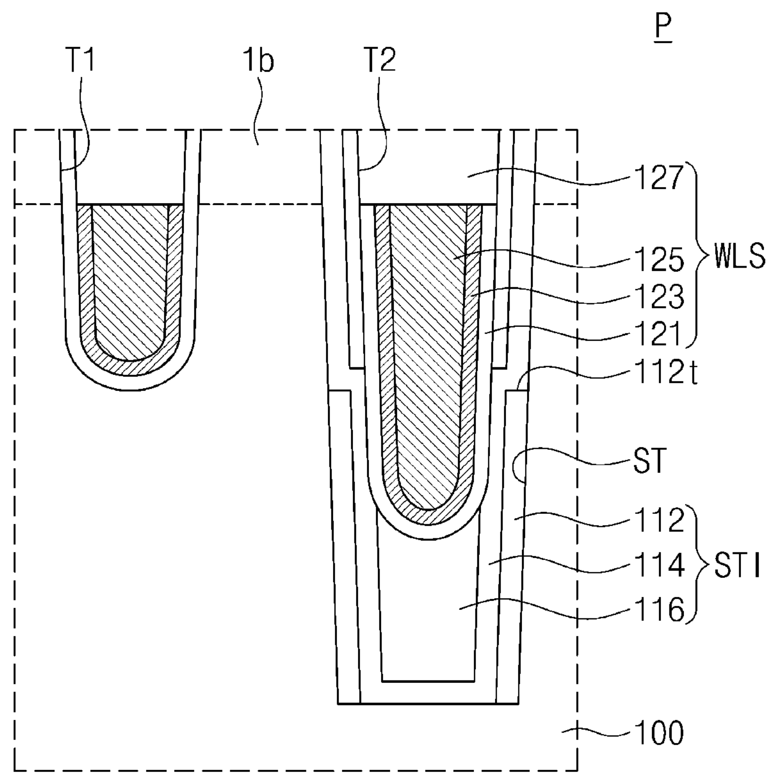

FIG. 1 illustrates a plan view showing a semiconductor memory device according to some example embodiments of the present disclosure. FIG. 2A illustrates a cross-sectional view taken along line A-A' of FIG. 1. FIG. 2B illustrates a cross-sectional view taken along lines B-B' and C-C' of FIG. 1. FIG. 2C illustrates a cross-sectional view taken along lines D-D' and E-E' of FIG. 1. FIGS. 3A and 3B are enlarged views of part 'P' of FIG. 2A.

Referring to FIGS. 1, 2A, 2B, and 2C, a semiconductor substrate 100 having device isolation trenches ST defining active regions ACT may be provided.

The semiconductor substrate 100 may be formed of and/or include a silicon substrate, a germanium substrate, and/or a silicon-germanium substrate.

The active regions ACT may have a rectangular shape (or bar shape) when viewed in a plan view, and may be two-dimensionally arranged in a first direction D1 and a second direction D2 crossing the first direction D1, for example, perpendicular to the first direction D1. The active regions ACT may be arranged in a zigzag shape when viewed from a plan view, and may have long (e.g., longitudinal) axes in a third direction D3 that is an oblique line with respect to the first and second directions D1 and D2.

The device isolation trench ST (a shallow trench formed in the substrate) may include a first portion having a first width between adjacent active regions in the first direction D1 and a second portion having a second width in the third direction D3 oblique with respect to the first and second directions D1 and D2. Here, the second width may be greater than the first width.

A device isolation layer STI (e.g., a shallow trench isolation layer) may be disposed in the device isolation trench ST. The device isolation layer STI disposed in the device isolation trench may further define the active regions. The device isolation layer STI may include a lower portion and an upper portion on the lower portion, and the lower portion may be formed of and/or include a low-k material having a lower dielectric constant than a material forming and/or included in the upper portion.

For example, the device isolation layer STI may include a low-k dielectric pattern 112, a liner insulating pattern 114, and a buried insulating pattern 116. Here, the low-k dielectric pattern 112 may be provided in a lower portion of the device isolation trench ST. The low-k dielectric pattern 112 may be formed of and/or include a low-k material having a lower dielectric constant than a material forming and/or included in the liner insulating pattern 114 and a material forming and/or included in the buried insulating pattern 116.

For example, the low-k dielectric pattern 112 may be formed of and/or include a low-k material having a lower dielectric constant than that of a silicon oxide layer. The low-k dielectric pattern 112 may be formed of and/or include a material having a dielectric constant of between about 1.0 to about 3.0. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. The low-k dielectric pattern 112 may be formed of and/or include silicon oxide containing carbon. The low-k dielectric pattern 112 may be formed of and/or include, for example, a silicon oxide layer-based material doped with impurities or an organic polymer having a low dielectric constant (low-k). The oxide layer-based material doped with impurities may be, for example, fluorine-doped oxide (FSG) layer, carbon-doped oxide (e.g., SiC, SiCN) layer, hydrogen silsesquioxane (HSQ; SiO:H), methyl silsesquioxane (MSQ; SiO:$CH_3$), or a-SiOC (SiOC:H).

Referring to FIG. 3A, the low-k dielectric pattern 112 has a substantially uniform thickness and may be in contact with a lower sidewall of the device isolation trench ST. The low-k dielectric pattern 112 may have a thickness ranging from about 50 Å to about 130 Å. The term "contact," "contacting," "contacts," or "in contact with," as used herein, refers to a direct connection (i.e., touching) unless the context clearly indicates otherwise. Terms such as "uniform," "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

The low-k dielectric pattern 112 may directly cover a bottom surface of the device isolation trench ST. Alternatively, as shown in FIG. 3B, the low-k dielectric pattern 112 may have a spacer shape disposed on a lower sidewall of the device isolation trench ST. That is, the low-k dielectric pattern 112 may not cover the bottom surface of the device isolation trench ST.

The liner insulating pattern 114 may cover an inner wall of the device isolation trench ST in which the low-k dielectric pattern 112 is formed with a uniform thickness. The liner insulating pattern 114 may be in contact with an upper sidewall of the device isolation trench ST. As shown in FIG. 3B, the liner insulating pattern 114 may be in contact with the bottom surface of the device isolation trench ST. The liner insulating pattern 114 may be in contact with portions of the surfaces of the device isolation trench ST that the low-k dielectric pattern 112 does not contact.

The liner insulating pattern 114 may be formed of and/or include, for example, silicon oxide. The liner insulating pattern 114 may have a thickness ranging from about 50 Å to about 130 Å.

The liner insulating pattern 114 may completely fill the device isolation trench ST excluding the sidewall in which the low-k dielectric pattern 112 is formed, in a region (e.g., a longitudinal portion) where a distance between the active regions ACT is narrow. For example, the liner insulating pattern 114 may completely fill the device isolation trench ST (exclusive of any low-k dielectric pattern 112) between the adjacent active regions ACT in the first direction D1.

The buried insulating pattern 116 may be disposed in a gap region defined by the liner insulating pattern 114. The buried insulating pattern 116 may completely fill the device isolation trench ST (exclusive of any low-k dielectric pattern 112 and any line insulating pattern 114) in which the low-k dielectric pattern 112 and the liner insulating pattern 114 are formed. An upper surface of the buried insulating pattern 116 may be substantially at the same level as an upper surface of the semiconductor substrate 100. The buried insulating pattern 116 may include at least one of a silicon oxide layer, a silicon oxynitride layer, and a silicon nitride layer.

Gate trenches GT may be provided in the semiconductor substrate 100. The gate trenches GT may cross the active regions ACT and the device isolation layer STI and may extend parallel to each other in the first direction D1.

Bottom surfaces of the gate trenches GT may have different depths at different sections depending on a material underlying a particular section. The gate trenches GT may include (e.g., be divided into) first trench sections T1 (e.g., a portion, extending lengthwise, of a respective gate trench) having a first depth d1 in the active regions ACT and second trench sections T2 (e.g., second portions, extending lengthwise, of a respective gate trench) having a second depth d2 in the device isolation layer STI. An item, layer, or portion of an item or layer described as extending "lengthwise" in a particular direction has a length in the particular direction and a width perpendicular to that direction, where the length is greater than the width. The second depth d2 may be greater than the first depth d1 such that a bottom surface of the second trench section T2 may be positioned at a lower level than a bottom surface of the first trench section T1 relative to the upper surface of the semiconductor substrate. As shown in FIG. 3A, the first trench section T1 may be positioned at a first level L1 and the second trench T2 may be positioned at a second level L2 lower than the first level L1. For example, the distance from the upper surface of the semiconductor substrate 100 to the first level L1 may be less that than the distance from the upper surface of the semiconductor substrate 100 to the second level L2.

Word lines WLS may be disposed in the gate trenches GT. One active region ACT may cross a pair of word lines WLS. Some of each word line WLS (e.g., a first portion of the word line WLS) may be provided in the first trench section T1 and other parts (e.g., portions other than the first portion of the word line WLS) may be provided in the second trench sections T2.

Each of the word lines WLS may include a gate insulating pattern 121, a gate barrier metal pattern 123, a gate conductive pattern 125, and a gate capping pattern 127.

The gate insulating pattern 121 may cover inner walls of the first and second trench sections T1 and T2 with a uniform thickness. The gate insulating pattern 121 may be formed of and/or include at least one of silicon oxide, silicon nitride, silicon oxynitride, and a high dielectric material.

The gate barrier metal pattern 123 may conformally cover the gate insulating pattern 121 in the first and second trench sections T1 and T2. The gate barrier metal pattern 123 may be interposed between the gate insulating pattern 121 and the gate conductive pattern 125.

The gate barrier metal pattern 123 may be formed of and/or include metal nitride. The gate barrier metal pattern 123 may be formed of and/or include, for example, at least one of titanium nitride (TiN), tungsten nitride (WN), and combinations thereof, but is not limited thereto.

An upper surface of the gate conductive pattern 125 may be lower than an upper surface of the semiconductor substrate 100. Upper surfaces of the gate conductive patterns 125 in the first and second trench sections T1 and T2 may be positioned at substantially the same level.

The gate conductive pattern 125 may be formed of and/or include a conductive material. The gate conductive pattern 125 may be formed of and/or include, for example, at least one of metal such as titanium (Ti), tantalum (Ta), tungsten (W), aluminum (Al), and cobalt (Co), and combinations thereof. Also, for example, the gate conductive pattern 125 may be formed of and/or include polysilicon or silicon germanium instead of metal.

The gate capping pattern 127 may be disposed on the gate barrier metal pattern 123 and the gate conductive pattern 125. An upper surface of the gate capping pattern 127 may be substantially coplanar with the upper surface of the semiconductor substrate 100 and the upper surface of the device isolation layer STI. The gate capping pattern 127 may be formed of and/or include, for example, a silicon nitride layer or a silicon oxynitride layer.

According to some example embodiments, a height of the word line structure WLS in the second trench section T2 may be greater than a height of the word line structure WLS in the first trench section T1. Each of the word lines WLS may include a first gate structure provided in the first trench section T1 and a second gate structure provided in the second trench section T2. Here, the second gate structure may include a lower portion positioned at a level lower than the bottom surface of the first trench section T1 and an upper portion on the lower portion. The lower portion of the second gate structure may be adjacent to the low-k dielectric pattern 112 of the device isolation layer STI. That is, the low-k dielectric pattern 112 may surround the lower portion of the second gate structure. The low-k dielectric pattern 112 may be provided between the active region ACT of the semiconductor substrate 100 and the lower portion of the second gate structure.

Referring to FIGS. 3A and 3B, an upper surface 112*t* of the low-k dielectric pattern 112 may be positioned at a level lower than upper surfaces of the first and second gate structures. More specifically, the upper surface 112*t* of the low-k dielectric pattern 112 may be positioned at a level between the bottom surface of the first trench section T1 and the bottom surface of the second trench section T2. For example, the upper surface 112*t* of the low-k dielectric pattern 112 may be positioned at substantially the same level as the bottom surface of the first trench section T1.

First and second impurity regions 1*a* and 1*b* (i.e., source and drain impurity regions) may be formed in each of the active regions ACT on both sides of the word lines WLS. Bottom surfaces of the first and second impurity regions 1*a* and 1*b* may be positioned at a certain depth from upper surfaces of the active regions ACT. The first impurity region 1*a* may be disposed in each of the active regions ACT between the word lines WLS, and the second impurity regions 1*b* may be spaced apart from the first impurity region 1*a* and disposed at end portions of each of the active regions ACT. The first and second impurity regions 1*a* and 1*b* may be doped with dopants having a conductivity type opposite to that of the semiconductor substrate 100.

A first interlayer insulating layer 130 may be disposed on the semiconductor substrate 100. The first interlayer insulating layer 130 may include a plurality of insulating layers. For example, the first interlayer insulating layer 130 may include a silicon oxide layer and a silicon nitride layer sequentially stacked. Alternatively, the first interlayer insulating layer 130 may be formed of a single layer. The first interlayer insulating layer 130 may simultaneously cover ends of two adjacent active regions ACT and a portion of the device isolation layer STI between them.

Bit lines BLS may extend in the second direction D2 across the word lines WL on the first interlayer insulating layer 130. Each of the bit lines BLS may be provided on the first impurity regions 1*a*. According to an example, the bit lines BLS may include a polysilicon pattern 141, a silicide pattern 143, a metal pattern 145, and a hard mask pattern 147 sequentially stacked. The first interlayer insulating layer 130 may be interposed between the polysilicon pattern 141 and the semiconductor substrate 100, and a portion of the polysilicon pattern 141 (hereinafter referred to as a bit line contact pattern DC) may be in contact with the first impurity region 1*a*. The silicide pattern 143 may be formed of and/or include at least one of titanium silicide, cobalt silicide, and nickel silicide. The metal pattern 145 may be formed of and/or include a conductive metal nitride (e.g., titanium nitride, tantalum nitride, etc.) and a metal (e.g., tungsten, titanium, tantalum, etc.). The hard mask pattern 147 may be formed of and/or include an insulating material such as silicon nitride.

A lower surface of the bit line contact pattern DC may be positioned below the upper surface of the semiconductor substrate 100 and may be positioned above upper surfaces of the word lines WL. In one example, the bit line contact pattern DC may be formed in the semiconductor substrate 100 and locally disposed in a recess region exposing the first impurity regions 1*a*. The recess region may have an elliptical shape, and a minimum width of the recess region may have a greater width than each of the bit lines BLS.

Bit line spacers SS may be disposed on sidewalls of the bit lines BLS. The bit line spacers SS may extend in the second direction D2 along one sidewalls of the bit lines BLS. The bit line spacers SS may be disposed between the sidewalls of the bit lines BLS and the buried contact pattern BC and between the sidewalls of the bit lines BLS and a fence pattern FP.

Fence patterns FP may be spaced apart from each other in the second direction D2 between the bit lines BLS. The fence patterns FP may be disposed between buried contact patterns BC adjacent to each other in the second direction D2. The fence patterns FP may overlap the word lines WL when viewed in a plan view, and the fence patterns FP may be disposed on the gate capping pattern 127. The fence patterns FP may have upper surfaces substantially at the same level as upper surfaces of the bit lines BLS. The fence patterns FP may be formed of and/or include an insulating material such as silicon nitride.

Buried contact patterns BC may be disposed between a pair of adjacent bit lines BLS. The buried contact patterns BC may be formed of and/or include polysilicon doped with impurities or a metal material. The buried contact patterns BC may be in contact with the second impurity regions 1*b*, respectively. The buried contact patterns BC may be disposed between the word lines WL and between the bit lines BLS, respectively, when viewed in a plan view.

The buried contact patterns BC may be two-dimensionally spaced apart from each other. For example, the buried contact patterns BC arranged in the first direction D1 may be spaced apart with the bit lines BLS interposed therebetween. The buried contact patterns BC arranged in the second direction D2 may be spaced apart with the fence patterns FP interposed therebetween. The buried contact patterns BC may fill a space defined by the bit lines BLS adjacent in the first direction D1 and the fence patterns FP adjacent in the second direction D2. Upper surfaces of the buried contact patterns BC may be positioned at a lower level than upper surfaces of the fence patterns FP and the upper surfaces of the bit lines BLS. The upper surfaces of the buried contact patterns BC may be positioned below an upper surface of the gate conductive pattern 125 of the bit line structure BLS.

Bottom surfaces of the buried contact patterns BC may be positioned below the upper surface of the semiconductor substrate 100 and may be positioned above a bottom surface of the bit line contact pattern DC. Also, the buried contact patterns BC may be spaced apart from the bit line contact patterns DC.

Landing pads LP may be disposed on the buried contact patterns BC, respectively. The landing pads LP may be electrically connected to the buried contact patterns BC, respectively.

An upper surface of the landing pad LP may be positioned above the upper surfaces of the bit lines BLS, and a lower surface of the landing pad LP may be positioned below the upper surfaces of the bit lines BLS. For example, the lower surface of the landing pad LP may be positioned below an upper surface of the gate barrier metal pattern 123 of the bit line structure BLS.

According to some example embodiments, an upper portion of the landing pad LP may have a circular or elliptical shape when viewed in a plan view, and according to embodiments, may have the upper portion of the landing pad LP may have a rounded rhombic shape, a rounded trapezoidal shape, or a rounded quadrilateral shape. Each of the landing pads LP may include a contact silicide pattern, a barrier metal pattern, and a metal pattern.

The contact silicide pattern covers the upper surface of the buried contact pattern BC and may be formed of and/or include, for example, titanium silicide, cobalt silicide, nickel silicide, tungsten silicide, platinum silicide, or molybdenum silicide. In another example, the contact silicide pattern may be omitted. The landing pad LP may be formed of and/or include a conductive metal nitride (e.g., titanium nitride, tantalum nitride, tungsten nitride, etc.) and a metal (e.g., tungsten, titanium, tantalum, etc.).

According to some example embodiments, data storage patterns DS may be respectively disposed on the landing pads LP. The data storage patterns DS may be electrically connected to the second impurity regions 1*b* through the landing pads LP and the buried contact patterns BC, respectively. Each of the data storage patterns DS may be misaligned from each of the landing pads LP and may be in partial contact with each of the landing pads LP. In one example, the data storage patterns DS may be disposed in a honeycomb shape or a zigzag shape when viewed in a plan view.

According to some example embodiments, the data storage patterns DS may be capacitors and may include a dielectric layer interposed between lower and upper electrodes. Alternatively, the data storage patterns DS may be variable resistance patterns that are capable of being switched into two resistance states by an electrical pulse applied to a memory element. For example, the data storage patterns DS may include a phase-change material, perovskite compounds, transition metal oxides, and magnetic material, ferromagnetic materials or antiferromagnetic materials, whose crystalline state changes depending on the amount of current.

FIGS. 4 to 8 illustrate cross-sectional views showing semiconductor memory devices according to various example embodiments of the present disclosure, which are taken along the line A-A' of FIG. 1. For brevity of description, descriptions of the same or substantially similar technical features as the semiconductor device described with reference to FIGS. 1, 2A, 2B, and 2C may be omitted.

Figure 4:
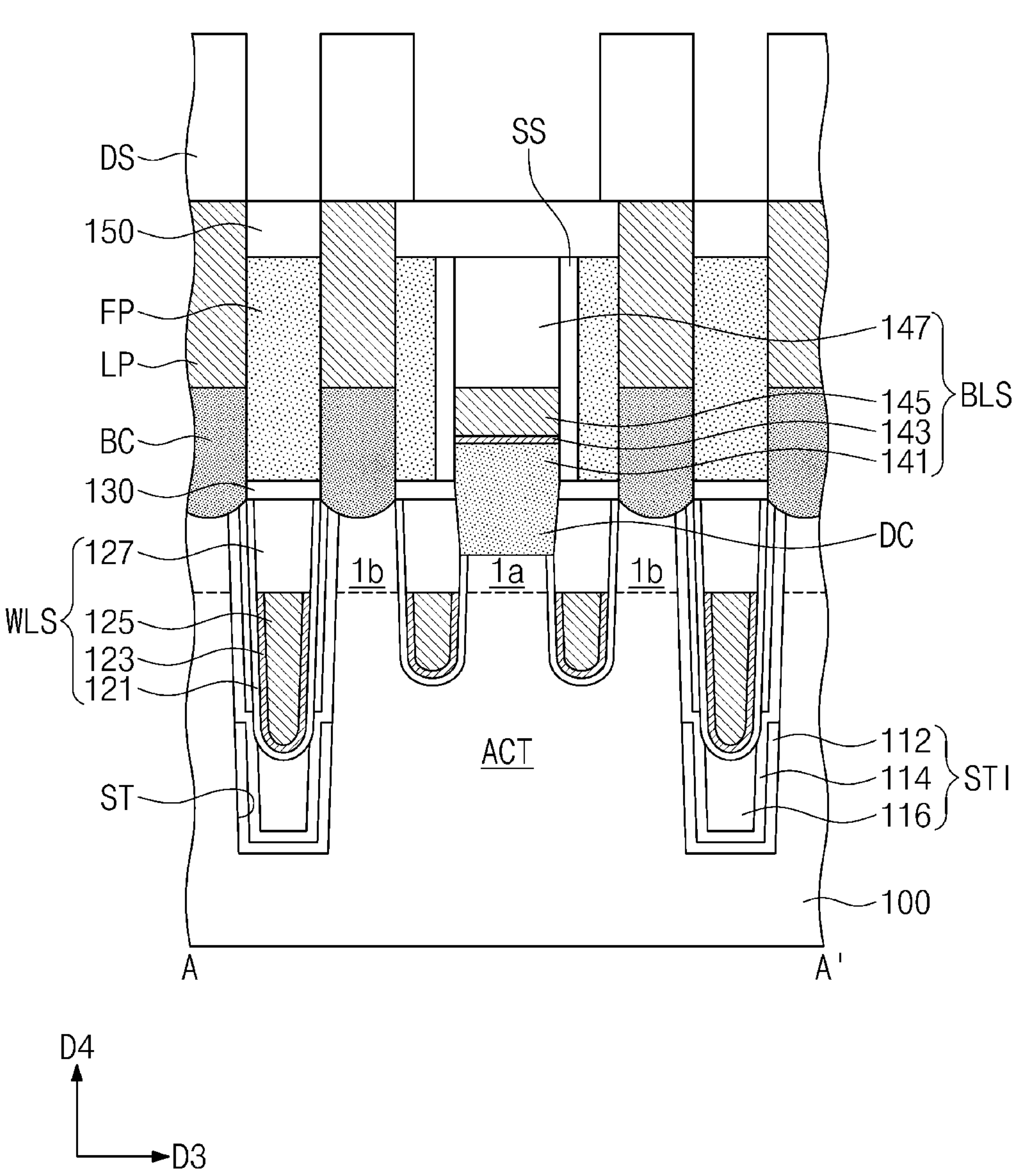
FIGS. 4 to 8 illustrate cross-sectional views showing semiconductor memory devices according to various example embodiments of the present disclosure, which are taken along the line A-A' of FIG. 1.

According to the example embodiment illustrated in FIG. 4, a device isolation layer STI may be disposed in the device isolation trench ST. The device isolation layer STI may include a low-k dielectric pattern 112, a liner insulating pattern 114, and a buried insulating pattern 116. As described above, the low-k dielectric pattern 112 may surround a lower portion of the second gate structure provided in the second trench section T2. Here, the upper surface of the low-k dielectric pattern 112 may be positioned at a level lower than the bottom surface of the first trench section T1 and may be positioned at a level higher than the bottom surface of the second trench section T2.

Figure 5:
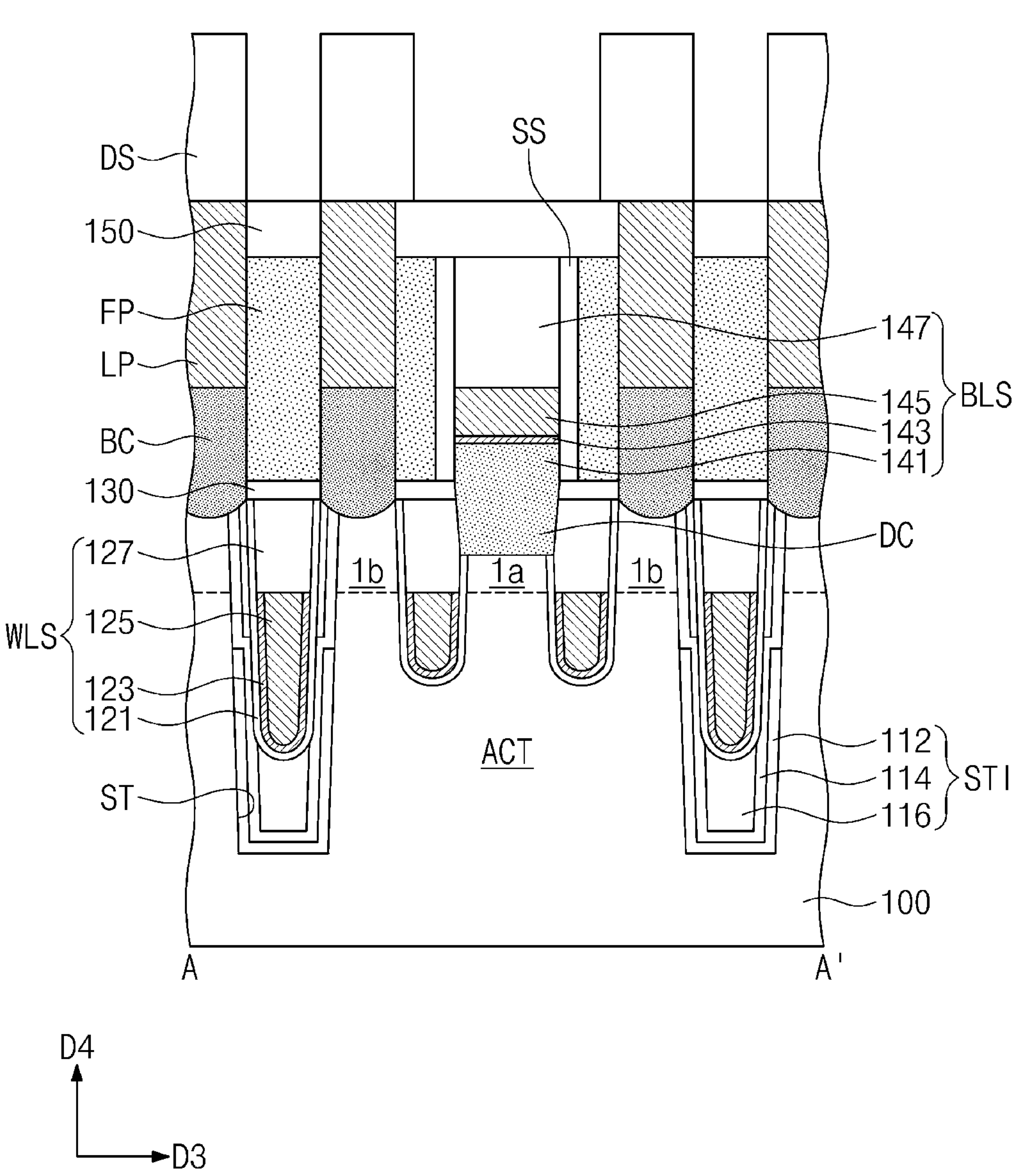

According to the example embodiment shown in FIG. 5, the upper surface of the low-k dielectric pattern 112 may be positioned at a level lower than the upper surface of the gate conductive pattern 125 and higher than the bottom surface of the first trench section T1.

Figure 6:
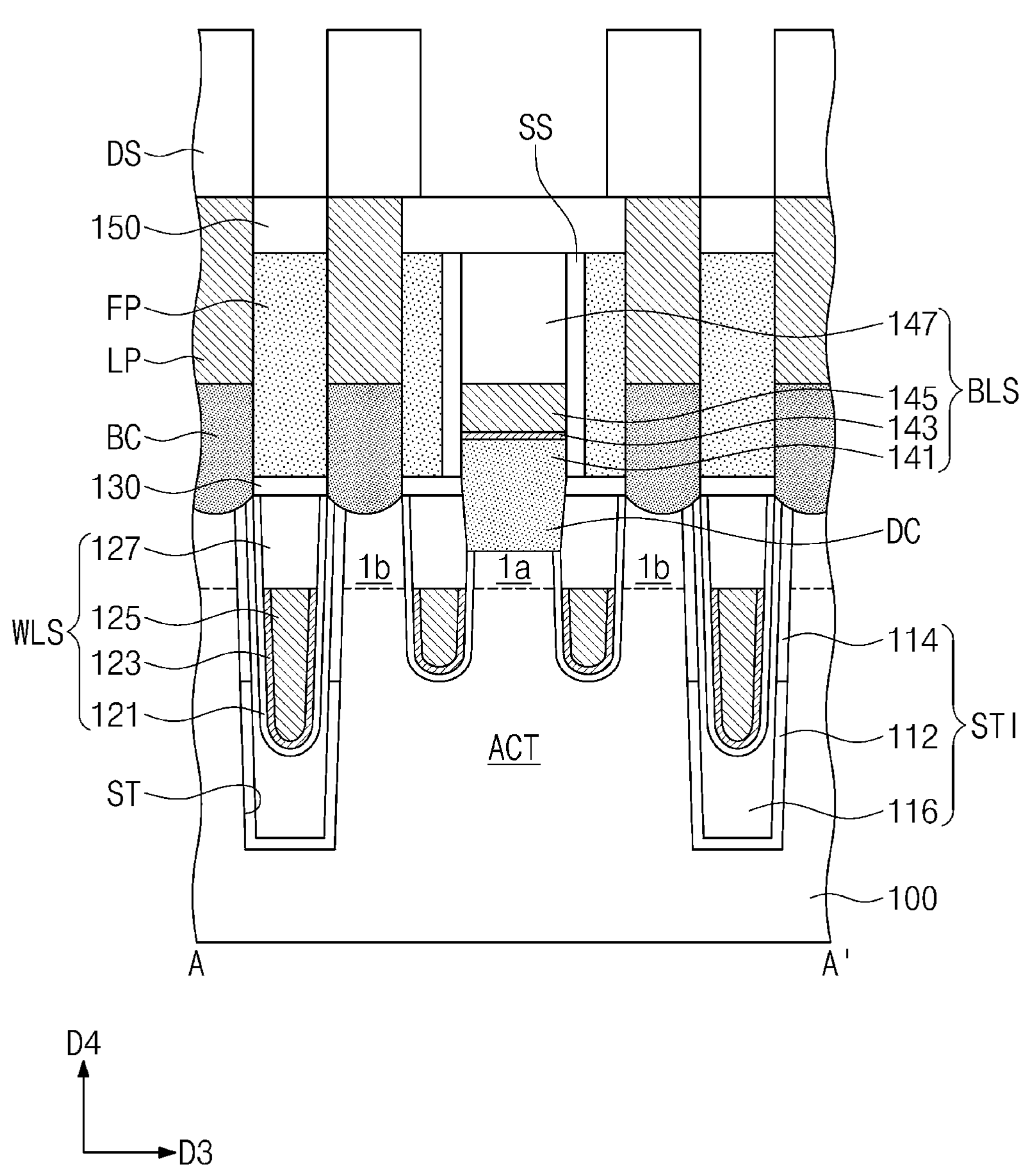

According to the example embodiment illustrated in FIG. 6, the device isolation layer STI may include a low-k dielectric pattern 112, a liner insulating pattern 114, and a buried insulating pattern 116. Here, the buried insulating pattern 116 may be in contact with the surface of the low-k dielectric pattern 112 and the surface of the liner insulating pattern 114. The low-k dielectric pattern 112 may be in contact with the lower sidewall of the device isolation trench ST, and the liner insulating pattern 114 may be in contact with the upper sidewall of the device isolation trench ST. The bottom surface of the liner insulating pattern 114 may be in contact with the upper surface of the low-k dielectric pattern 112. The bottom surface of the liner insulating pattern 114 may be positioned at a higher level than the bottom surface of the second trench T2.

Figure 7:
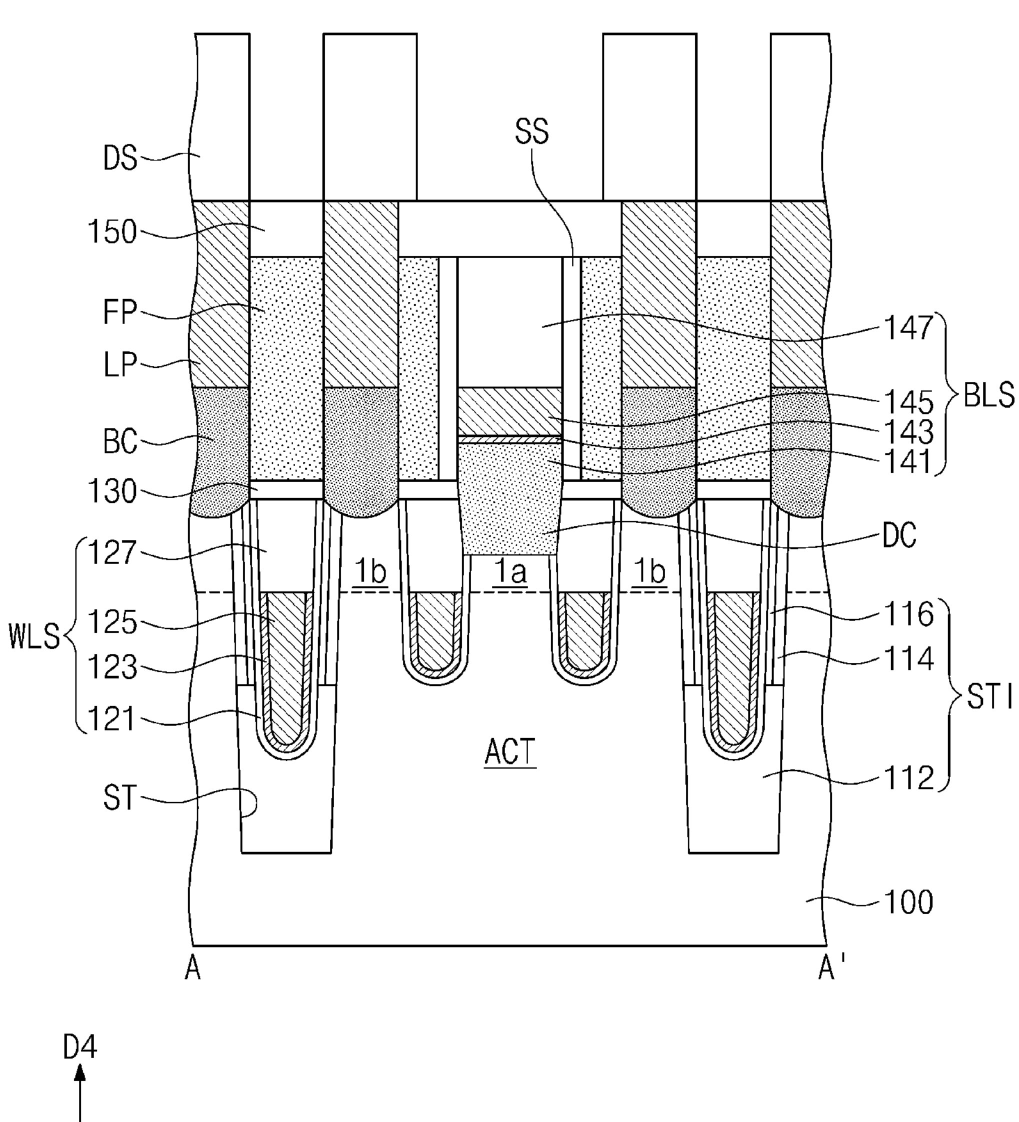

According to the example embodiment illustrated in FIG. 7, the device isolation layer STI may be a structure including a low-k dielectric pattern 112, a liner insulating pattern 114, and a buried insulating pattern 116. Here, a lower portion of the device isolation trench ST may be completely filled with the low-k dielectric pattern 112. The low-k dielectric pattern 112 may surround a lower portion of the second gate structure provided in the second trench section T2. The upper surface of the low-k dielectric pattern 112 may be positioned at a level between the upper surface of the gate conductive pattern 125 and the bottom surface of the second trench section T2.

Figure 8:
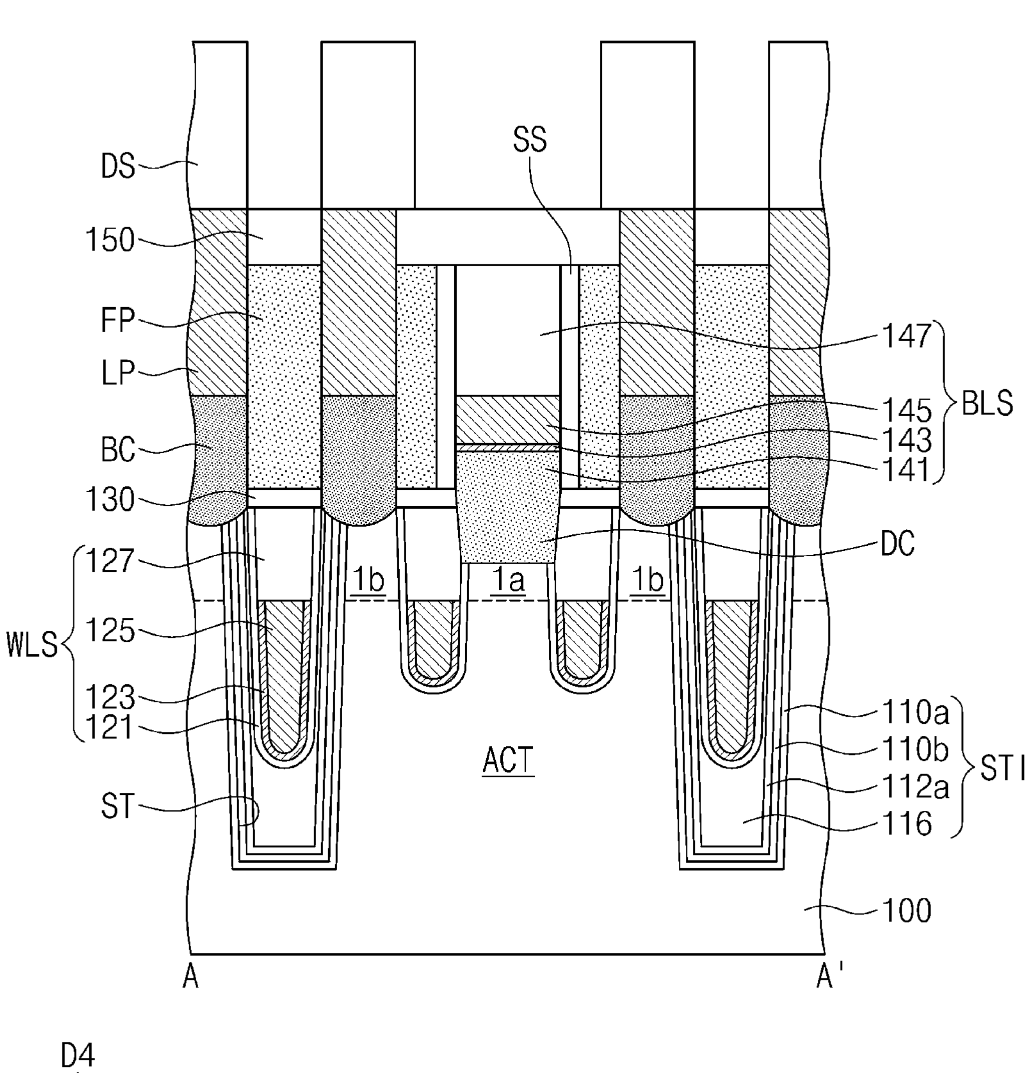

Referring to FIG. 8, the device isolation layer STI may include a first liner insulating pattern 110*a*, a second liner insulating pattern 110*b*, a liner low-k dielectric pattern 112*a*, and a buried insulating pattern 116 that are sequentially stacked on the inner wall of the device isolation trench ST.

The first and second liner insulating patterns 110*a* and 110*b* and the liner low-k dielectric pattern 112*a* conformally cover the inner wall of the device isolation trench ST. The first liner insulating pattern 110*a* may be in contact with the semiconductor substrate 100.

The first and second liner insulating patterns 110*a* and 110*b* may be formed of and/or include, for example, a silicon-based insulating material (e.g., silicon nitride, silicon oxide, and/or silicon oxynitride) and/or a high dielectric material (e.g., silicon oxynitride, hafnium oxide and/or aluminum oxide). For example, the first liner insulating pattern 110*a* may be formed of and/or include silicon oxide, and the second liner insulating pattern 110*b* may be formed of and/or include silicon nitride.

The liner low-k dielectric pattern 112*a* may conformally cover the second liner insulating pattern 110*b*. The liner low-k dielectric pattern 112*a* may be formed of a low-k material having a lower dielectric constant than those of materials forming the first and second liner insulating patterns 110*a* and 110*b*. For example, the liner low-k dielectric pattern 112*a* may be formed of a low-k material having a lower dielectric constant than that of a silicon oxide layer. The liner low-k dielectric pattern 112*a* may be formed of and/or include a material having a dielectric constant of about 1.0 to about 3.0. The liner low-k dielectric pattern 112*a* may be formed of and/or include silicon oxide containing carbon. The liner low-k dielectric pattern 112*a* may be formed of and/or include, for example, an insulating material such as SiC, SiCN, SiOCH, SiOC, and SiOF.

Each of the first and second liner insulating patterns 110*a* and 110*b* may have a thickness ranging from about 50 Å to about 130 Å. The liner low-k dielectric pattern 112*a* may have a thickness ranging from about 50 Å to about 130 Å.

FIGS. 9 to 16 illustrate cross-sectional views for explaining a method of manufacturing a semiconductor memory device according to some example embodiments of the present disclosure, which are taken along the line A-A' of FIG. 1.

Figure 9:
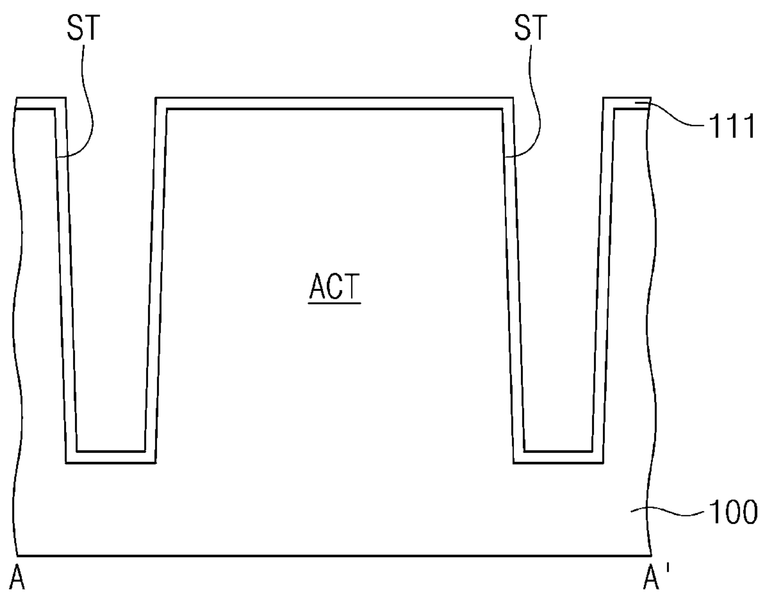
FIGS. 9 to 16 illustrate cross-sectional views for explaining a method of manufacturing a semiconductor memory device according to some example embodiments of the present disclosure, which are taken along the line A-A' of FIG. 1.

Referring to FIGS. 1 and 9, device isolation trenches ST defining active regions ACT may be formed in a semiconductor substrate 100. The semiconductor substrate 100 may be a silicon substrate, a germanium substrate, and/or a silicon-germanium substrate.

The device isolation trench ST may be formed by forming a mask pattern (not shown) on the semiconductor substrate 100 and anisotropically etching the semiconductor substrate 100 to a certain depth using the mask pattern as an etching mask.

The device isolation trench ST may have a first width between adjacent active regions ACT in a first direction D1, and may have a second width greater than the first width between active regions ACT adjacent in a third direction D3.

The active regions ACT may have a rectangular shape (or bar shape) having a major axis in the third direction D3. The active regions ACT may be two-dimensionally arranged in the first direction D1 and a second direction D2 crossing the first direction D1 (e.g., perpendicular to the first direction D1). The active regions ACT may be arranged in a zigzag shape when viewed in a plan view, and may have major axes in an oblique direction D3 with respect to the first and second directions D1 and D2.

After the device isolation trench ST is formed, a low-k dielectric layer 111 conformally covering an inner wall of the device isolation trench ST may be formed.

The low-k dielectric layer 111 may be formed using a deposition technique having excellent property of step coverage, such as chemical vapor deposition (CVD) or atomic layer deposition (ALD).

The low-k dielectric layer 111 may be formed of and/or include a low-k material having a lower dielectric constant than that of a silicon oxide layer. The low-k dielectric layer 111 may be formed of and/or include a material having a dielectric constant of about 1.0 to about 3.0, and may be formed of and/or include at least one of organic, inorganic, and organic-inorganic hybrid materials.

The low-k dielectric layer 111 may be formed of, for example, a silicon oxide layer-based material doped with impurities or an organic polymer having a low dielectric constant (low-k). The oxide-based materials doped with impurities may be, for example, fluorine-doped oxide (FSG) layer, carbon-doped oxide layer, hydrogen silsesquioxane (HSQ; SiO:H), methyl silsesquioxane (MSQ; SiO:$CH_3$), or a-SiOC (SiOC:H).

Figure 10:
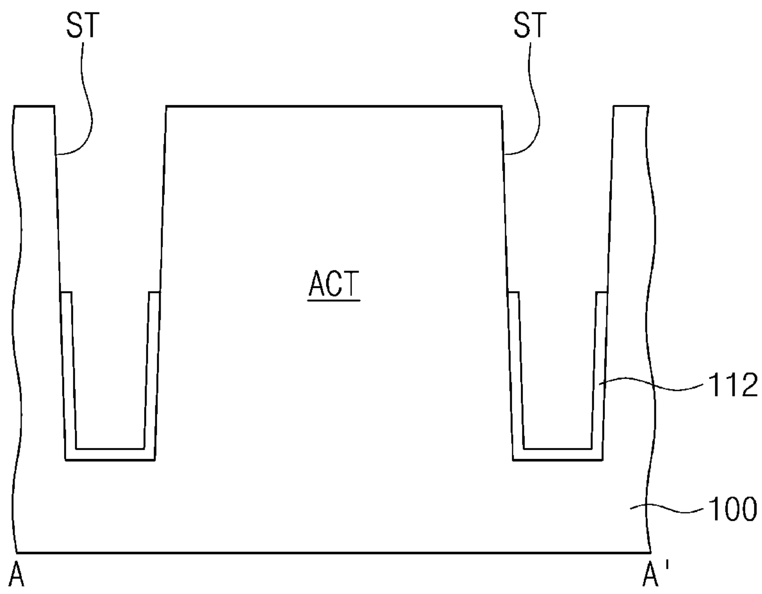

Referring to FIGS. 1 and 10, a low-k dielectric pattern 112 may be formed in the device isolation trench ST by performing an anisotropic etching (e.g., etch-back) process on the low-k dielectric layer 111.

The low-k dielectric layer 111 may anisotropically etched to expose upper sidewalls of the device isolation trench ST. During the anisotropic etching of the low-k dielectric layer 111, the low-k dielectric layer 111 may also be etched from a bottom surface of the isolation trench ST, thereby exposing the bottom surface of the isolation trench ST.

Figure 11:
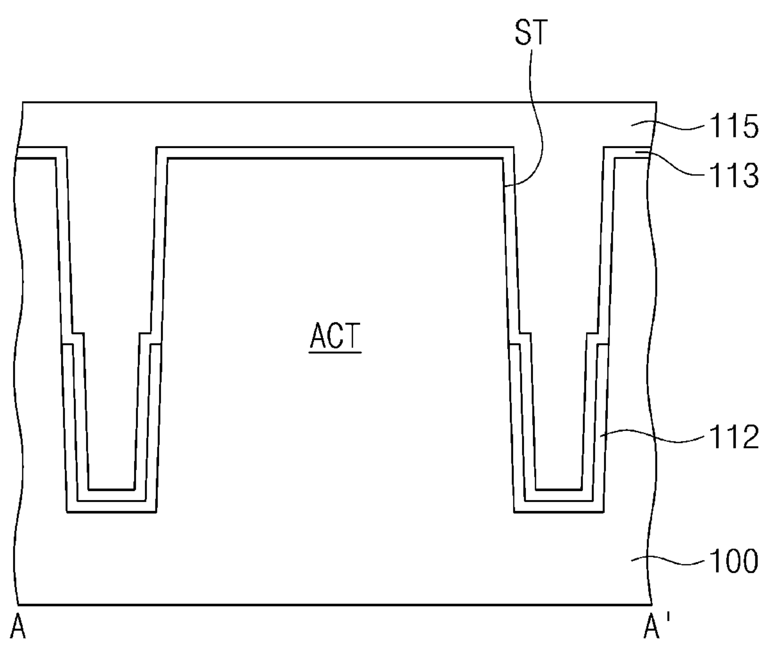

Referring to FIGS. 1 and 11, an insulating liner layer 113 and a buried insulating layer 115 may be sequentially formed on the low-k dielectric pattern 112.

The insulating liner layer 113 may be formed using a thermal oxidation process or a deposition process. The insulating liner layer 113 may be formed using a layer-formation technique having excellent properties of step coverage, such as chemical vapor deposition (CVD) or atomic layer deposition (ALD). When the insulating liner layer 113 is formed by performing the deposition process, the insulating liner layer 113 may be formed to a uniform thickness on the upper sidewall of the device isolation trench ST and a surface of the low-k dielectric pattern 112. In the case of performing the thermal oxidation process, the insulating liner layer 113 may be selectively formed on the surface of the semiconductor substrate 100.

Furthermore, as shown in FIG. 2C, the insulating liner layer may completely fill the device isolation trench ST between adjacent active regions in the first direction D2.

Then, the buried insulating layer 115 filling the device isolation trench ST in which the insulating liner layer 113 is formed may be formed. The buried insulating layer 115 may be formed of and/or include, for example, silicon oxide, silicon nitride, and/or silicon oxynitride.

The buried insulating layer 115 may be formed using a layer-formation technique having excellent properties of step coverage, such as chemical vapor deposition (CVD) or atomic layer deposition (ALD). In this case, the buried insulating pattern 116 may completely fill the device isolation trench ST in which the insulating liner layer 113 is formed. In some embodiments, the buried insulating layer 115 may fill the device isolation trench ST between adjacent active regions ACT in the third direction D3.

Figure 12:
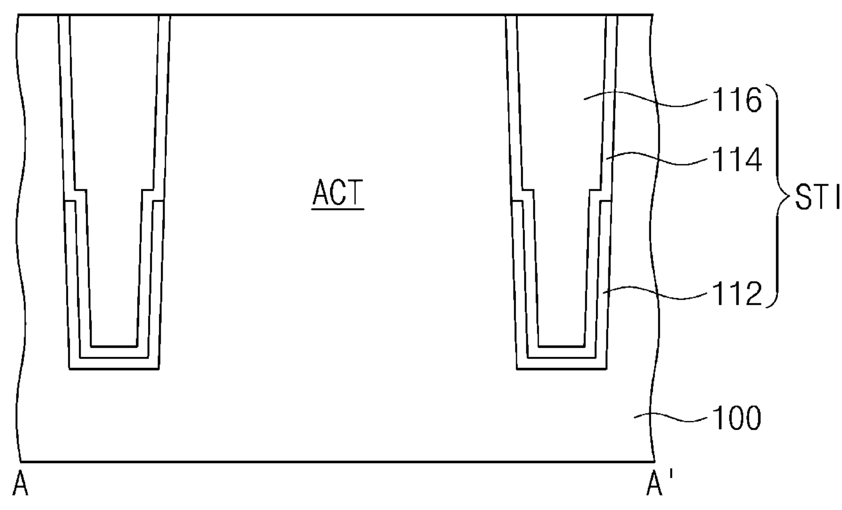

Referring to FIGS. 1 and 12, a planarization process may be performed on the insulating liner layer 113 and the buried insulating layer 115 such that an upper surface of the semiconductor substrate 100 is exposed. Accordingly, the insulating liner layer 113 and the buried insulating layer 115 may be partially removed to expose the upper surface of the semiconductor substrate 100. That is, a device isolation layer STI may be formed in the device isolation trench ST. An upper surface of the device isolation layer STI may be coplanar with the upper surface of the semiconductor substrate 100. As the planarization process, a chemical mechanical polishing (CMP) process and an etch-back process may be used.

Figure 13:
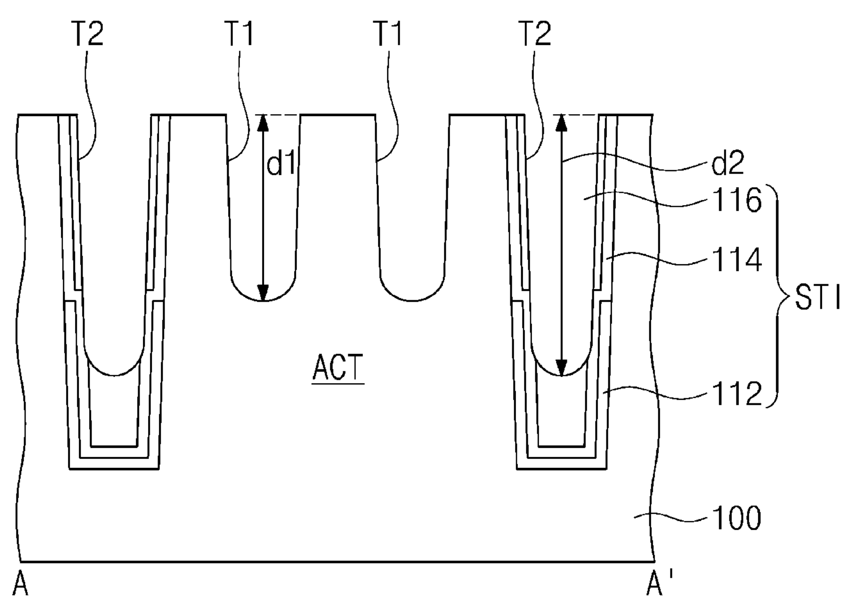

Referring to FIGS. 1 and 13, gate trenches GT including the first trench section T1 and the second trench section T2 may be formed in the semiconductor substrate 100. The gate trenches GT may be formed by patterning portions of the active regions ACT and portions of the device isolation layer STI.

In detail, forming the gate trenches GT includes forming mask patterns (not shown) extending in the first direction D1 across the active regions ACT on the semiconductor substrate 100 and anisotropically etching the semiconductor substrate 100 using mask patterns (not shown) as an etching mask. Here, during the anisotropic etching process, portions of the device isolation layer STI and portions of the active regions ACT may be etched.

During the anisotropic etching process, the first trench sections T1 having a first depth d1 may be formed in the active regions ACT, and the second trench sections T2 having a second depth d2 greater than the first depth d1 may be formed in the device isolation layer STI, based on the underlying material differences. Here, bottom surfaces of the second trench sections T2 may be positioned at a level lower than an upper surface of the low-k dielectric pattern 112. Widths of the gate trench sections T1 and T2 may be smaller than a distance between adjacent active regions ACT in the third direction D3 (i.e., a width of the device isolation layer STI).

Figure 14:
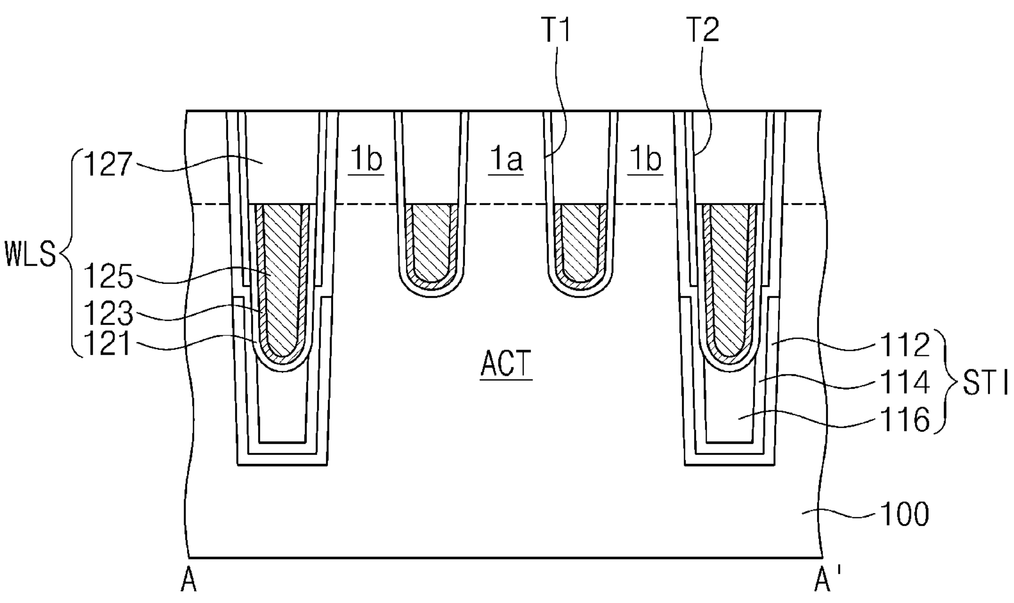

Referring to FIGS. 1 and 14, word lines WLS may be formed in the gate trenches GT.

In detail, after forming the gate trenches GT, a gate insulating layer, a gate barrier metal layer, and a gate conductive layer may be sequentially formed in the gate trenches GT, and the gate barrier metal layer and the gate conductive layer may be etched to locally form a gate barrier metal pattern 123 and a gate conductive pattern 125 in the gate trenches GT. The gate insulating layer may be deposited to a uniform thickness on inner walls of the gate trenches GT.

Subsequently, a gate capping pattern 127 filling the gate trenches GT may be formed on the gate barrier metal pattern 123 and the gate conductive pattern 125.

After forming the word lines WLS, first and second impurity regions 1*a* and 1*b* may be formed in the active regions ACT on both sides of the word lines WLS. The first and second impurity regions 1*a* and 1*b* may be formed by performing an ion implantation process and may have a conductivity type opposite to that of the active regions ACT.

Figure 15:
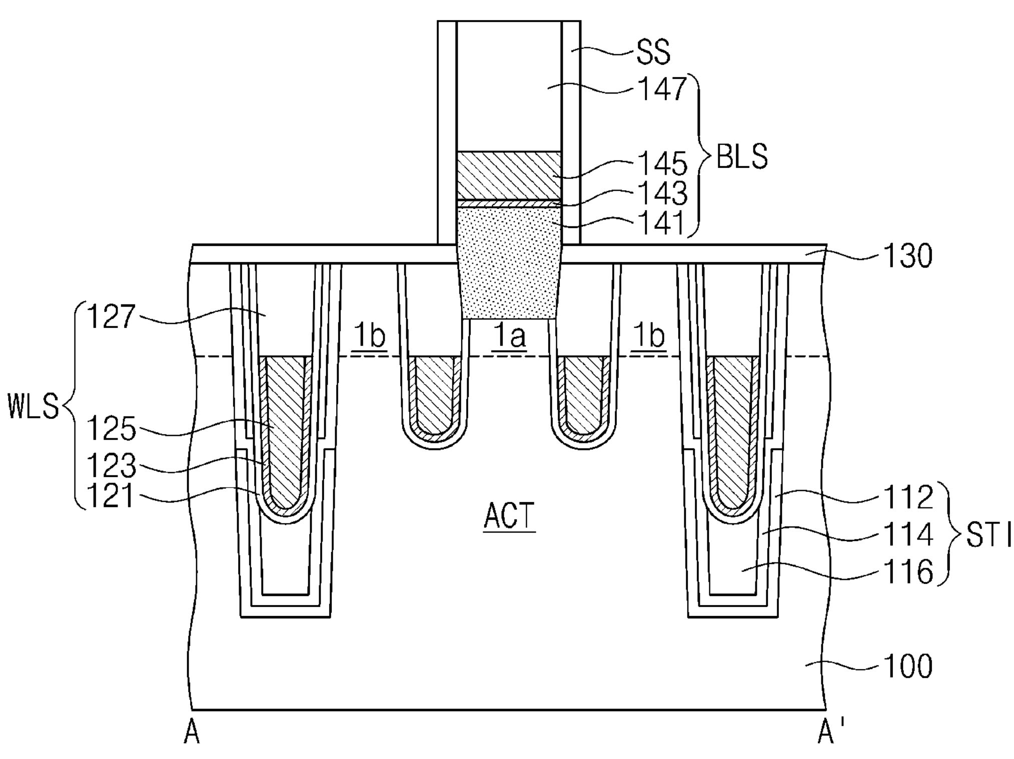

Referring to FIGS. 1 and 15, a first interlayer insulating layer 130 may be formed on the entire surface of the semiconductor substrate 100. The first interlayer insulating layer 130 may include a single layer or a plurality of insulating layers. The first interlayer insulating layer 130 may include, for example, a silicon oxide layer, a silicon nitride layer, and/or a silicon oxynitride layer.

Subsequently, the semiconductor substrate 100 and the first interlayer insulating layer 130 may be patterned to form contact recess regions exposing central portions of each active region ACT. In one example, the contact recess regions may have an elliptical shape having a major axis in the second direction D2. Also, the contact recess regions may be arranged in a zigzag or honeycomb shape when viewed in a plan view. A portion of the device isolation layer STI may be etched by an etching process for forming contact recess regions.

Subsequently, bit lines BLS extending in the second direction D2 may be formed on the first interlayer insulating layer 130 having the contact recess regions.

Forming the bit lines BLS may include forming a first conductive layer filling the contact recess regions on the first interlayer insulating layer 130, forming a second conductive layer on the first conductive layer, forming a hard mask layer on the second conductive layer, forming a bit line mask pattern on the hard mask layer, and etching the first conductive layer, the second conductive layer, and the hard mask layer sequentially using the bit line mask pattern. Here, the first conductive layer may be formed of a semiconductor layer (e.g., doped polysilicon layer) doped with impurities, and the second conductive layer may be formed of a metal layer such as a tungsten layer, an aluminum layer, a titanium layer, or a tantalum layer. Furthermore, a metal silicide layer may be formed between the first conductive layer and the second conductive layer.

As the bit lines BLS are formed, the bit lines BLS may include polysilicon patterns 141, silicide patterns 143, metal patterns 145, and hard mask patterns 147 sequentially stacked. Here, a portion of the polysilicon pattern 141 may be locally formed in the contact recess regions and constitute a bit line contact pattern DC in contact with the first impurity region 1*a*.

Thereafter, bit line spacers SS may be formed on sidewalls of the bit lines BLS. The bit line spacers SS may extend in the second direction D2 along sidewalls of the bit lines BLS. The bit line spacers SS may be formed of a single layer or a multilayer layer.

Figure 16:
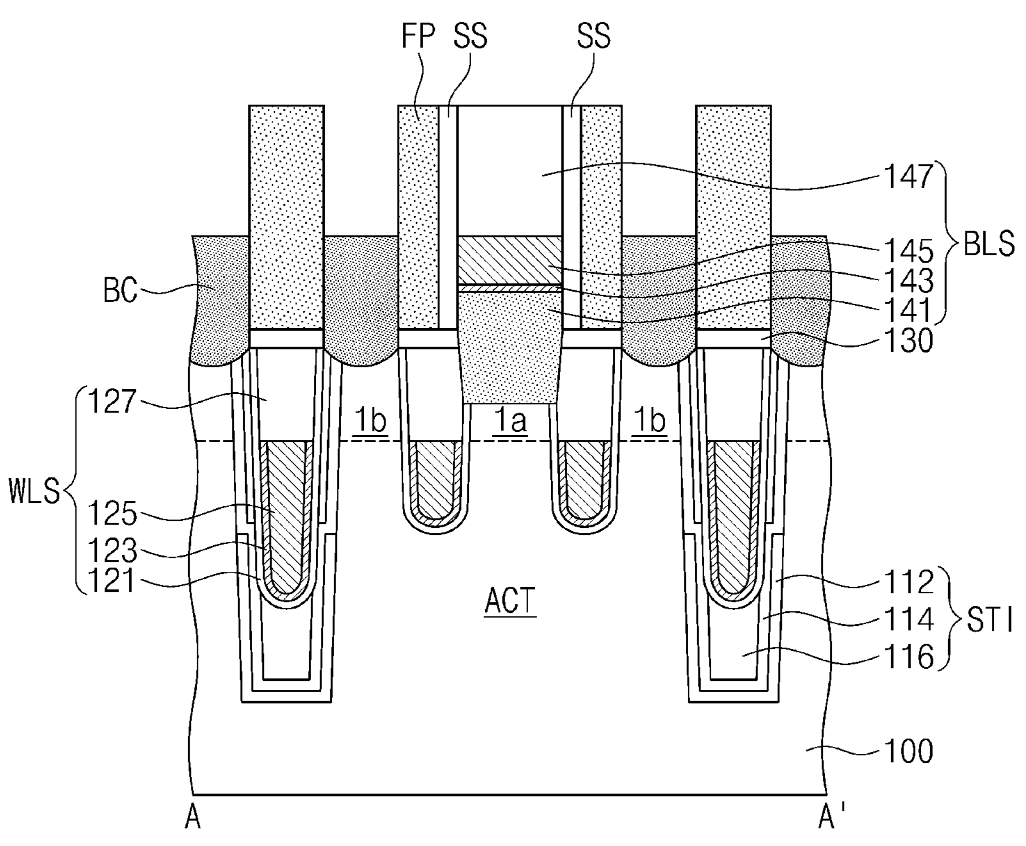

Then, referring to FIGS. 1 and 16, fence patterns FP may be formed on the word lines WLS between the bit lines BLS.

The fence patterns FP may be spaced apart from each other in the second direction D2 between each of the bit lines BLS. The fence patterns FP may be formed of and/or include, for example, silicon oxide, silicon nitride, and/or silicon oxynitride.

After forming the fence patterns FP, contact holes may be formed between the bit lines BLS to locally expose portions of the active regions ACT. The contact holes may be defined by the bit lines BLS and the fence patterns FP when viewed in a plan view. The contact holes may be formed by anisotropically etching a portion of the first interlayer insulating layer 130, a portion of the semiconductor substrate 100, and a portion of the device isolation layer STI. Bottom surfaces of the contact holes may be positioned below the upper surface of the semiconductor substrate 100.

Subsequently, buried contact patterns BC filling the contact holes H may be formed. The buried contact patterns BC may be in contact with the second impurity regions 1*b* on both sides of the bit lines BLS. Upper surfaces of the buried contact patterns BC may be positioned below the upper surface of the hard mask patterns 147 of the bit lines BLS and may be positioned above the upper surface of the semiconductor substrate 100.

Forming the buried contact patterns BC may include depositing a conductive layer filling the contact holes, planarizing the conductive layer to expose upper surfaces of the bit lines BLS and the fence patterns FP, and recessing an upper surface of the conductive layer.

Again, referring to FIGS. 1 and 2A, landing pads LP connected to the buried contact patterns BC may be formed, respectively.

Forming the landing pads LP may include conformally depositing a barrier metal layer on the entire surface of the semiconductor substrate 100, forming a metal layer filling the contact region on the barrier metal layer, forming mask patterns (not shown) on the metal layer, and forming a pad recess region by sequentially etching the metal layer and barrier metal layer using mask patterns as an etching mask. When forming the landing pads LP, contact silicide patterns may be respectively formed between the upper surfaces of the buried contact patterns BC and the landing pads LP.

The second interlayer insulating layer 150 may fill between upper portions of the landing pads LP.

Subsequently, data storage elements DS may be formed on each of the landing pads LP. The data storage element DS may be provided in various forms. For example, the data storage element DS may be implemented as a capacitor or a variable resistor.

According to some example embodiments, the device isolation layer may include the low-dielectric pattern surrounding the lower portion of the word line structure disposed therein, and the low-k dielectric pattern may reduce the effect on the active region adjacent to the word line in the device isolation layer when the specific word line is intensively accessed.

Accordingly, the phenomenon in which the electrons stored in the data storage pattern (i.e., the capacitor) adjacent to the word line structure in the device isolation layer are lost when the specific word line is intensively accessed, that is, the row hammer or single row disturb characteristics may be improved.

While embodiments are described above, a person skilled in the art may understand that many modifications and variations are made without departing from the spirit and scope of the present disclosure defined in the following claims. Accordingly, the example embodiments of the present disclosure should be considered in all respects as illustrative and not restrictive, with the spirit and scope of the present disclosure being indicated by the appended claims.

What is claimed is:

1. A semiconductor device comprising:

a semiconductor substrate having a device isolation trench defining active regions;

a device isolation layer disposed in the device isolation trench;

gate trenches extending in a first direction with each gate trench crossing a respective plurality of the active regions of the semiconductor substrate and the device isolation layer; and word lines disposed in the gate trenches, respectively, wherein each of the gate trenches includes first trench sections in respective active regions and a second trench section in the device isolation layer, the first trench sections have a first depth, and the second trench section has a second depth greater than the first depth, wherein the device isolation layer includes a lower portion positioned at a level lower than bottom surfaces of the first trench sections and an upper portion on the lower portion, wherein the lower portion of the device isolation layer is formed of a dielectric material having a lower dielectric constant than that of the upper portion, and wherein an upper surface of the dielectric material having a lower dielectric constant than that of the upper portion is positioned at a level between the bottom surfaces of the first trench sections and a bottom surface of the second trench section.

2. The semiconductor device of claim 1, wherein the device isolation layer includes:

a low-k dielectric pattern covering a lower sidewall of the device isolation trench;

a liner insulating pattern covering an upper sidewall of the device isolation trench; and a buried insulating pattern on the liner insulating pattern.

3. The semiconductor device of claim 2, wherein the low-k dielectric pattern includes a dielectric material having a lower dielectric constant than that of the liner insulating pattern.

4. The semiconductor device of claim 2, wherein a portion of the liner insulating pattern covers an upper surface of the low-k dielectric pattern.

5. The semiconductor device of claim 2, wherein the low-k dielectric pattern includes SiC, SiCN, SiCOH, SiOC or SiOF.

6. The semiconductor device of claim 2, wherein the device isolation trench includes a first portion having a first width between adjacent active regions in the first direction and a second portion having a second width greater than the first width in a second direction different from the first direction, and wherein the liner insulating pattern fills the first portion on the low-k dielectric pattern.

7. The semiconductor device of claim 1, wherein the device isolation layer includes:

a low-k dielectric pattern filling a lower portion of the device isolation trench; and a liner insulating pattern covering an upper sidewall of the device isolation trench and being disposed on the low-k dielectric pattern.

8. The semiconductor device of claim 1, wherein the active regions are spaced apart from each other and arranged two-dimensionally, and wherein the second trench section of each of the gate trenches is disposed between respective active regions that are adjacent to each other.

9. The semiconductor device of claim 7, wherein each of the word lines includes a gate conductive pattern, a gate capping pattern on the gate conductive pattern, and a gate insulating pattern between the gate conductive pattern and the semiconductor substrate, and wherein upper surfaces of the gate conductive patterns are positioned at substantially the same level in the first trench sections and the second trench section.

10. The semiconductor device of claim 9, wherein an upper surface of the low-k dielectric pattern is lower than an upper surface of the gate conductive pattern and is positioned at a level higher than a bottom surface of the second trench section.

11. The semiconductor device of claim 9, wherein an upper portion of the gate conductive pattern in the second trench section is adjacent to the liner insulating pattern, and wherein a lower portion of the gate conductive pattern in the second trench section is adjacent to the low-k dielectric pattern.

12. A semiconductor device comprising:

a semiconductor substrate;

a device isolation layer disposed in the semiconductor substrate and defining active regions;

a first gate trench having a first trench section provided in the active regions and having a first depth;

a second gate trench having a second trench section provided in the device isolation layer and having a second depth greater than the first depth;

a first gate structure in the first trench section; and a second gate structure in the second trench section, wherein the second gate structure includes a lower portion positioned at a level lower than a bottom surface of the first trench section and an upper portion on the lower portion, and wherein the device isolation layer includes:

a low-k dielectric pattern between the active regions and the lower portion of the second gate structure and an upper surface of the low-k dielectric pattern is positioned at a level lower than upper surfaces of the first and second gate structures and higher than a bottom surface of the second trench section; and a liner insulating pattern between the active regions and the upper portion of the second gate structure.

13. The semiconductor device of claim 12, wherein the device isolation layer includes a first portion having a first width between the active regions adjacent to each other in a first direction and a second portion having a second width greater than the first width between the active regions adjacent to each other in a second direction, and wherein the second gate structure is disposed in the second portion of the device isolation layer.

14. The semiconductor device of claim 13, wherein the device isolation layer further includes a buried insulating pattern on the low-k dielectric pattern in the second portion.

15. A semiconductor device comprising:

a semiconductor substrate;

a device isolation layer disposed in the semiconductor substrate and defining active regions;

gate trenches extending in a first direction with each gate trench crossing a respective plurality of the active regions and the device isolation layer;

word lines with each word line disposed in a respective gate trench, each of the word lines including a gate conductive pattern, a gate capping pattern on the gate conductive pattern, and a gate insulating pattern between the semiconductor substrate and the gate conductive pattern;

a bit line extending in a second direction intersecting with the first direction across the word lines;

a bit line contact pattern between the bit line and the active regions;

bit line spacers disposed on sidewalls of the bit line;

contact patterns disposed on the semiconductor substrate and connected to end portions of the active regions; and data storage patterns connected to the contact patterns, wherein each of the gate trenches includes first trench sections in the active regions and a second trench section in the device isolation layer, and a recess depth of the second trench section is greater than a recess depth of the first trench sections, wherein the device isolation layer includes a lower portion positioned at a level lower than bottom surfaces of the first trench sections and an upper portion on the lower portion, and wherein the lower portion is formed of a dielectric material having a lower dielectric constant than that of a material forming the upper portion.

16. The semiconductor device of claim 15, wherein the device isolation layer includes:

a low-k dielectric pattern between the active regions and a lower portion of the second trench section; and a liner insulating pattern between the active regions and an upper portion of the second trench section.

17. The semiconductor device of claim 15, wherein the upper portion of the device isolation layer includes silicon oxide, and wherein the lower portion of the device isolation layer includes SiCOH.

18. The semiconductor device of claim 15, wherein the lower portion of the device isolation layer includes a low-k dielectric pattern, and Wherein the low-k dielectric pattern is positioned at a level lower than upper surfaces of the gate conductive patterns of the word lines and higher than a bottom surface of the second trench section.

* * * * *